(12) United States Patent
Chapman et al.

(10) Patent No.: US 6,641,978 B1
(45) Date of Patent: Nov. 4, 2003

(54) DRY MULTILAYER INORGANIC ALLOY THERMAL RESIST FOR LITHOGRAPHIC PROCESSING AND IMAGE CREATION

(75) Inventors: Glenn Harrison Chapman, Coquitlam (CA); Marinko Venci Sarunic, Coquitlam (CA); Yugiang Tu, Burnaby (CA)

(73) Assignee: Creo SRL, Burnaby (CA)

( * ) Notice: Subject to any disclaimer, the term of this patent is extended or adjusted under 35 U.S.C. 154(b) by 0 days.

(21) Appl. No.: 09/618,065

(22) Filed: Jul. 17, 2000

(51) Int. Cl.$^7$ .............................. G03C 1/76; G03C 5/00
(52) U.S. Cl. ................... 430/296; 430/270.1; 430/312
(58) Field of Search .......................... 430/296, 5, 312, 430/313, 314, 315, 316, 317, 318, 270.1, 270

(56) References Cited

U.S. PATENT DOCUMENTS

| | | | |
|---|---|---|---|
| 3,873,341 A | 3/1975 | Janus | 117/37 R |
| 4,587,533 A | 5/1986 | Nakane | 346/135.1 |
| 4,619,894 A | 10/1986 | Bozler | 430/942 |
| 5,851,729 A | 12/1998 | Takeuchi | 430/270.12 |
| 5,998,066 A * | 12/1999 | Block et al. | 430/5 |

OTHER PUBLICATIONS

Gelbart and Karasyuk, Proc. SPIE Emerging Lithographic Technologies III, v 3676, pp 786–793 (1999).

* cited by examiner

Primary Examiner—Mark F. Huff
Assistant Examiner—Saleha R. Mohamedulla
(74) Attorney, Agent, or Firm—Oyen Wiggs Green & Mutala

(57) ABSTRACT

A thermal inorganic resist for lithographic processes and image creation is disclosed. In one embodiment an In layer of 15 nm is deposited, followed by a Bi layer of 15 nm. Upon exposure to a optical light pulse of sufficient intensity the optical absorption heats the film above the eutectic melting point (110° C. for BiIn) and the resist forms an alloy in the exposed area, replicating patterns projected on its surface. Optical characteristics of the alloyed layers are in these resists typically different from the unexposed layers creating a visual image of the exposure pattern before the development etch aiding in exposure control. The resist layer is then stripped, leaving the pattern layer on the substrate. In resists showing significant optical differences (such as BiIn) after exposure this same material can be used to create images for data storage, and, when transparent, photomasks for optical lithography.

31 Claims, 6 Drawing Sheets

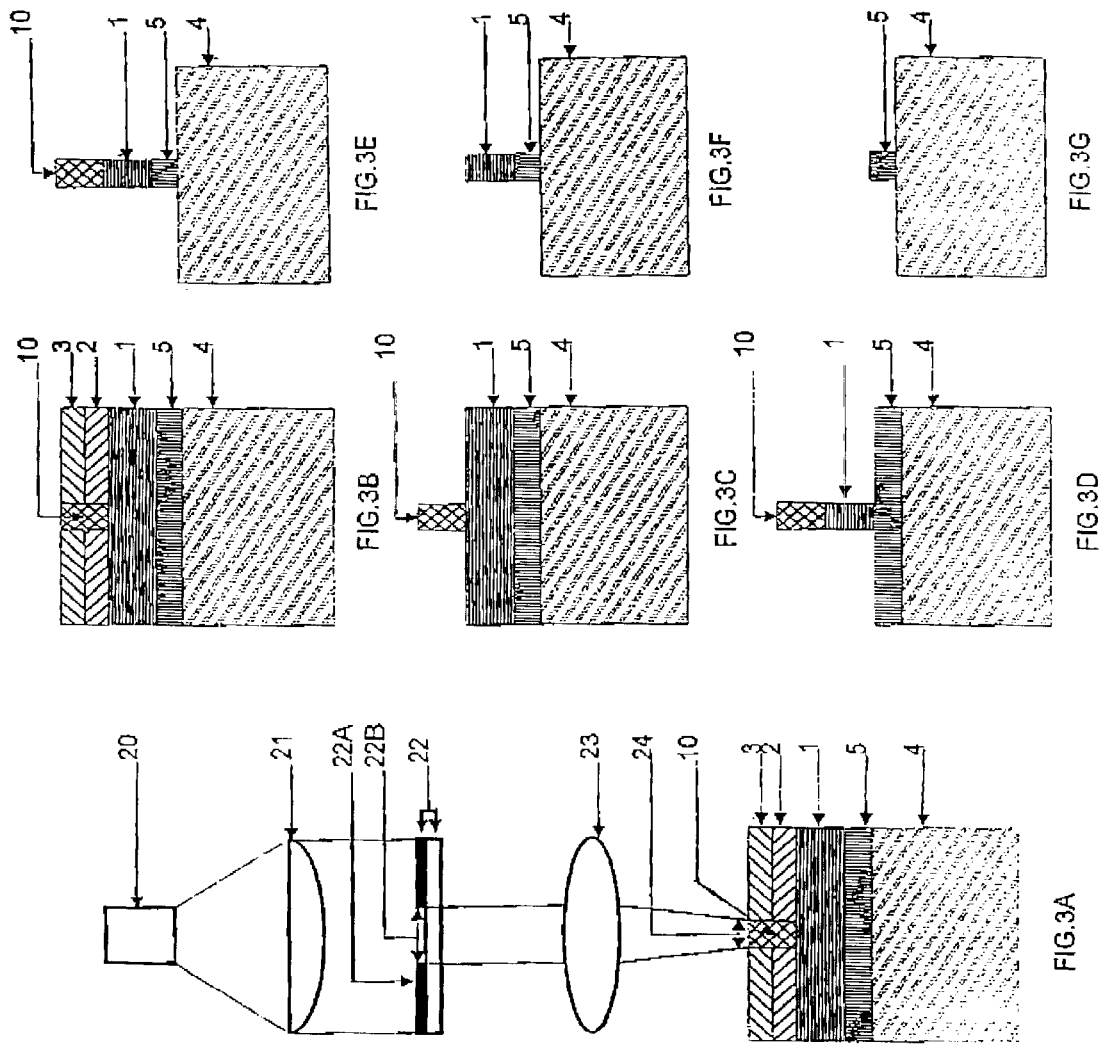

DRY MULTILAYER INORGANIC ALLOY THERMAL RESIST FOR LITHOGRAPHIC PROCESSING AND IMAGE CREATION

TECHNICAL FIELD

The technical field to which this invention pertains is the creation of multilayered inorganic films which can react thermally to create structures for patterning layers applicable both to lithographic processes, such as those used in integrated circuit fabrication, and the making of images in thin films, such as is required in creating optical masks.

BACKGROUND OF THE INVENTION

Integrated circuit and semiconductor devices are built using microfabrication lithographic techniques to pattern many layers of conductors, insulators or semiconductors. In lithography a masking layer, called a resist, is deposited on the device substrate and exposed by optically projecting an image onto its surface. For optically sensitive resists (photoresists) a chemical reaction changes the resist. Typically after development the areas exposed to the light will be removed, while those not exposed will remain creating a raised pattern of resist on the surface (a reverse or negative resist process is also possible). This raised pattern protects parts of layers below so that when exposed to an etching environment (for example acids, etching gases or plasmas or ion beams) the areas under the remaining resist are protected from etching, while those without resist are preferentially removed. This resist layer is then striped or removed leaving a transferred raised pattern from the mask in the layer on the substrate. The patterned layer may be used directly as defined or in turn may be used to pattern a layer below it on the substrate, either for additional etching processes, or other operations (for example creating doped patterns with impurities, or growing patterned oxide layers). Repeated processes of layer deposition and resist lithographic patterning are used to create everything from simple single layer structures to complex integrated circuits.

Indeed the very photomasks used in the optical lithographic process are created by directly writing with a focused laser or electron beam spot a pattern into a resist on an optically transparent substrate, usually coated with a thin absorbing layer. That resist pattern then defines the etching of the lower layer, patterning the absorbing and non-absorbing areas on the transparent substrate creating the mask used in other lithographic processes.

Current lithographic processes typically use organic based photoresists which are applied as liquids to a substrate or wafer which is then spun at high speeds so that interaction of rotational, gravitational forces, surface tension and viscosity creates a controlled thickness of resist. The film is then baked to remove solvents before the photolithographic exposure. The photoresist is then developed using a wet chemical processes that dissolves the unwanted resist away. After the lithographic etching processes the photoresist is stripped (often in an oxygen plasma etcher or with liquid strippers). However it is very hard to remove all the organics added by the resist, and there is always the danger of other outside contaminants. Hence very aggressive chemical cleans, such as the industrial standard RCA clean, must be used to remove these organics. This combination of steps: cleaning, deposition or growth of a layer, photolithographic definition, etching and resist stripping is repeated for each layer and pattern to make the final circuit of even the simplest device. These cleaning processes are very time, energy and material consuming. Resist contamination left behind is a common source of defect creation in integrated circuit processes.

In contrast to the wet organic photoresists and their related cleanups most other processes in modern microfabrication are dry, often vacuum based procedures. Many types of deposition (plasma sputtering, Chemical Vapour Deposition (CVD), ion implant) and etching processes (Plasma, Reactive Ion Etching (RIE)) use low-pressure techniques that introduce much fewer contaninants into the processes.

In addition to contamination problems organic resists are very wavelength sensitive. Current optical exposure systems use Ultra Violet (UV) Excimer lasers operating at 248 nm wavelength as the light source, producing short (5–20 nsec.) pulses of high power for exposure to create the small structures needed. Resists for the current 248 nm wavelengths will not work for the future generations of exposure systems which currently plan to use 193 nm, 150 nm or even shorter wavelengths to make structures smaller than 0.1 microns. Furthermore, at those shorter wavelengths and high power pulses many organic resist materials are damaged (photoablated) because the energy of the UV light tears apart the molecules of the organics. This photoablation can cause problems with materials deposited on the exposed optics.

These problems have suggested that a switch to inorganic based dry resist processes would provide significant advantages. Firstly, a dry resist process would permit devices to be fabricated mostly in a vacuum based environment, allowing transfer from a dry based deposition (for example sputter deposition) to the dry inorganic resist coating, to the exposure, etching (say plasma etching) to the resist stripping processes. This would keep devices much cleaner, offering less source of contamination, and hence potentially reducing the rate of defects. Secondly the removal of the organics from the resists may significantly reduce the number of cleans needed in process steps with savings in time, materials and energy. Thirdly many organic resists are thermally activated, that is the optical exposure creates a local temperature rise, which in turn creates the inorganic reaction for the development. Thermal resists, especially those using metal-based inorganics, can be less wavelength sensitive and operate at very short wavelengths. Fourthly metal-based inorganics can avoid the photoablation effect down to very short wavelengths. Fifthly thermally reacted inorganics can show different optical characteristics after exposure than before. Thus the exposed areas can be identified before the development processes. This allows errors in exposure to be corrected.

Finally Gelbart and Karasyuk have shown that with thermal resists and a special multiple exposure modification existing optical exposure systems could substantially decrease the minimum size structures they can build. Current exposure systems are diffraction limited by their optics and need to use shorter wavelengths (193 nm and 150 nm) to pattern structures below 0.1 to 0.07 microns. However Gelbart and Karasyuk show that by use of a multiple exposure modification to existing (248 nm) systems resolution below 0.1 microns may be possible and below 0.1 micron with shorter wavelengths. This multiple exposure system only works for resists that do not follow the law of reciprocity. The law of reciprocity says that total exposure is integrated over time, meaning that two exposures at half-threshold have the same outcome as one exposure at full threshold; in either case the resist will be fully developed. Thermal resists react when the resist is heated above a certain temperature and do not follow reciprocity. Thus, if a thermal resist is heated to just below the threshold, allowed to cool, and then heated a second time to the same point, it will remain unexposed. In a microfabrication exposure system, UV light arrives in pulses of a few tens of nanoseconds spaced hundreds of microseconds apart. This means that there is sufficient time for the material to cool between UV exposures. By comparison standard photoresists follow the law of reciprocity and a multiply exposure system produces the same result as a regular exposure.

While thermal inorganic resists offer these advantages previous art has shown these resists have, until now, had significant problems, especially with their sensitivity. Janus in U.S. Pat. No. 3,873,341 proposed an amorphous iron oxide based film as a thermal resist. When heated by the optical exposure system the amorphous iron oxide is crystallized if the local temperature exceeds 820° C. The crystallized iron oxide areas are attacked by acid more rapidly than the amorphous, and hence can be selectively removed. However, this high threshold temperature would require unacceptable exposure light intensities in current optical exposure systems.

Bozler et al. in U.S. Pat. No. 4,619,894 offers another thermal inorganic resist consisting of an aluminum film deposited in a low-pressure oxygen atmosphere. This creates an aluminum oxide cermet. When exposed to a UV laser pulse the cermet is converted from a conductive phase to a highly resistive oxide phase. This resistive material is also etched at a much lower rate by a phosphoric acid etch than the cermet, thus creating the desired resist structure. While the optical exposure requires by the cermet resist is 1000 times less than the Janus resist, it is still requires temperatures in the 300° C. range, and thus exposures 4–10 times greater than current resists, requiring 40 to 100 mJ per square cm of UV light in the 20 nsec laser pulse. Current resists require about 10 mJ per square cm per pulse of UV light for exposure.

Using lasers to alloy film layers and alter their reflectivity is well known in the creating of optical writeable disks for information storage. In particular Takeuchi et al. in U.S. Pat. No. 5,851,729 describes a system using a Bismuth—Tellurium Bi—Te alloy layer that is sandwiched between two Antimony—Selenium Sb—Se films. When hit with a laser the 3 layers alloy to create a Bi—Te—Sb—Se film with different reflectance than that of the unalloyed layer. Nakane in U.S. Pat. No. 4,587,533 teaches another optical write alloying system using a transparent layer with a lower melting temperature than the metal layer of Te, Bi, Sb or In. The laser light passes through the upper layer, and melts the lower which alloys with the transparent upper layer to significantly change the materials reflectivity. However while Takeuchi, Nakane and others teach the multilayer alloying concept they focus on creating alloys whose optical characteristics, especially their reflectivities, substantially change from the unexposed to alloyed state. The relative etching rate of the unexposed and alloyed areas is not considered or discussed as important in their choice of materials. For a workable thermal resist for microfabrication, the change in the optical characteristics is of much less importance than the etch ratio of the unexposed and alloyed films. Optical changes would be useful to identify the exposed area before development, but it is not necessary for a successfully functioning thermal resist. Optical changes may be useful in some applications like creating photomasks but should not be the most important issue for thermal inorganic resists. In addition the optical writeable disk technologies all require that the unexposed multilayers not be alloyed by the laser beams reading the disk information. Since these reading lasers are typically 1–2 mW of laser light focused to spots of less than one micron this requires a significant thermal threshold (typically more than 250–400° C.) before the alloying can occur. However good thermal resists require the opposite condition: the lower the thermal reaction temperature the more sensitive to illumination is the resist making it more desirable. Indeed the exposure induced by the optical writable disk readout laser is typically in the 400,000 W/sq cm range making it unacceptable in current photolithographic exposure systems. Thus the alloys and processes best for optical disk writing are poor candidates for thermal inorganic resists just on thermal energy considerations.

The Janus and Bozler thermal inorganic resists are still too insensitive for most applications. In addition they are specific to particular materials and thus hard to modify to improve the process. Accordingly what is needed is a more general way of creating inorganic resists that offers a range of materials that can be explored for resists that have both good sensitivity (UV exposure requirements) and are compatible with current integrated circuit contamination requirements. In addition some optical characteristics of some inorganic resists in this class may make them useful for creating optical masks directly if their light absorption can be changed from a highly absorptive state to a less absorptive one. This innovation offers the potential for addressing all of these needs.

SUMMARY OF THE INVENTION

This invention discloses a general class of dry inorganic thermal resists based on a multilayer process. In its simplest form the thermally active layer consists of a lower thin film of one inorganic material, usually single element metals of binary metal alloys (in one example an Indium (In) film). This film is deposited via a dry process (for example sputter deposition or CVD deposition). Usually in the same deposition system a second layer of another inorganic film is deposited, again commonly a single element metals or binary metal alloys (in one example a Bismuth (Bi) film). In more complex forms there may be more than two layers. The materials that are potential candidates for the two or more layer films are those that show in their phase diagrams a low temperature alloy, a eutectic, whose melting point is below that of the two individual films. Best results occur for eutectic temperatures below 300° C. and preferentially below 200° C., with temperatures of 100° C. or below being possible with some alloys. Some phase diagrams show more than one phase material ratio with temperatures below the individual layer melting points. Thus, when heated by optical exposures that create temperatures in the film above the eutectic point, the films begin to alloy at the interface between the layers. Since the alloy has a lower melting point than either individual film, this reaction will occur at a much lower temperature than the melting or vaporization temperatures of the individual films. None of the films tested show ablation of the materials after exposure at levels near the threshold. The ratio of the film thicknesses must be such that when fully combined the resulting alloy will near the desired composition. Since current laser optical UV microlithographic exposure systems involve very short pulses (about 20 nsec or less) the relatively low average energy of exposure actually involves very high instantaneous optical powers during a single pulse (10 mJ per square cm in 20 nsec. is 0.5 megawatts of power per square cm during the pulse). Such high powers drive the alloying process if the film is thin enough.

In addition to the low temperature eutectic point the films should show important thermal and optical characteristics.

Both materials must have a sufficiently low thermal conductivity that the heated area does not create temperatures in adjacent areas to exceed the threshold temperature during and after the laser pulse (given tile pulse to pulse variation in exposures that occur in typical systems and thus the required exposures above the threshold levels to produce uniform results). The area over which the heat would spread will determine the resolution of the film, and for current applications should allow resolutions of less than 0.1 microns. In addition the lower the thermal conductivity the less energy needed to heat the local area above the thermal reaction point.

Optical absorption characteristics of the films also determine the combined layer of thickness and the order of the layers. The order of which material is on the top layer is often set to give a minimum reflection and maximum absorption with the film. For proper choice the material's optical index of refraction and absorption index at the desired wavelengths should be calculated to obtain these. Total film thicknesses are best when the optical energy absorption rate allows energy deposition in both film layers. As many films are highly absorbing metals calculations must be done using optical multilayer thin film analysis including complex indexes, and Poynting Vector analysis, both including the effects of internal reflections. In general the actual energy deposited in the film per unit volume increases as thickness decreases, resulting in more sensitivity for total film thickness less than 70 nm. The films are in general only modestly wavelength sensitive. For some metal films the wavelength range of successful operation tested has ranged from the Near Infrared (860 nm) to UV (266 nm). There are however different exposure requirements at different wavelengths. While films less than 70 nm provide best sensitivity thicker films (up to at least 300 nm) show the same alloying effects, but required ore laser power.

While an alloying action is the simplest, some alloys may also combine with oxygen, nitrogen or hydrogen to form films with significantly different characteristics than both the thin layer materials or their oxides, nitrides or hydrides. This may occur either with gases in the atmosphere above the films during exposure, or from atoms trapped in the film during deposition, or even from layers that are oxides to begin with (usually the bottom layer).

The post-alloying characteristics needed are dependent on the application. Most useful materials show a significant optical change between the alloyed and non-alloyed areas. Depending on the materials used alloyed films range from little optical change to significant increases/decrease in reflectivity or color to films. Optical transmissions may significantly decrease, and in some tested cases actually go from nearly completely absorbing in the unexposed case to almost completely transparent in the alloyed case (as in the case of one embodiment, BiIn, films showing such changes). Films that alloy and show a substantial decrease in absorption may be used to directly write optical images photomasks for some applications.

The development etching characteristics of the alloyed layer in some materials are very different from the unalloyed material. General results have shown the alloyed material is much more resistant to etching than the unexposed layers. Etching rate ratios of alloyed to unexposed will depend on the specific etchant and etching processes used (for example wet acids or dry plasma). With some alloys (as in BiIn) a simple wet etchant will remove the unalloyed layer, leaving the alloyed layer. This development etch generally results in a negative thermal resist with the alloyed areas left behind and the unexposed areas removed.

The thermal inorganic resist layers are very thin (typically 30–70 nm). Also they are not resistive to all etchants needed for all commonly used layers on the substrate. In most applications an inactive protection layer is deposited before the multilayer resist is deposited. After the patterning exposure and development etch of the multilayer inorganic resist it acts as a mask layer for the protection layer. Protection layers are chosen to have a significantly different etch characteristic to that of the alloyed resist. For example in the case of metal multilayers a thick (about 1 micron) layer of carbon would be preferred. An oxygen plasma development etch would in many cases remove the carbon without attacking the alloyed resist. This leaves a multilayer developed resist consisting of the alloyed resist and protection layer. This provides significantly better protection for etching many of the lower layers.

To work in any microfabrication process a resist must be easy to strip or remove, leaving the substrate clean of any remnant resist or contamination, but without damaging any of the layers below this is especially important for reworking a resist definition that has defects in it. A microfabrication standard cleaning processes etch (RCA 2 or HCl: $H_2O_2$: $H_2O$ in the ratio 2:3:14) has proven successful in stripping the thermal inorganic resist in one case (BiIn). Dry etches or ion milling can also be used as the layer is very thin. The protection layer can be removed with a dry etch (Oxygen plasma in the case of a carbon layer). This will leave a clean substrate ready for the next processing step. It is notable that neither the Janus nor the Bozler patents discuss the strip process for their resists. Removal of the patterned cermet resist in Bozler case without damage to some metal layers below would be difficult.

Since more than one material combination has successfully shown some or all of these characteristics this patent discloses a general class of inorganic thermal resists that have low temperatures of conversion, form alloys over a wide wavelength range, do not show ablation of materials after exposure, show significant different optical parameters from the unexposed areas after the exposure allowing the patterning to be determined before development, more than one material is transparent after exposure making them candidates for optical masks, and some show a significant etching difference between the alloyed and unexposed materials allowing a development etch to pattern the layer, and yet have a simple resist strip.

BRIEF DESCRIPTION OF THE DRAWINGS

For a more complete understanding of the features, process steps, advantages and objects of the invention, reference should be made to the following detailed description and the accompanying drawings.

FIG. 1A through FIG. 1D illustrate a resist process with a lower protection layer.

FIG. 3A through FIG. 3G are partial schematic representations of one embodiment of the schematic cross section of the substrate and resist of FIG. 1A through FIG. 1D during the photolithographic processes which will pattern the resist with exposure and development etch, and transfer that pattern by etching to the layers of the substrate.

DETAILED DESCRIPTION

Figure 1A:
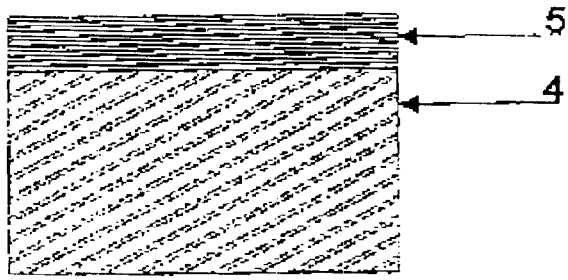
FIG. 1A through FIG. 1D are partial representations of one embodiment of the schematic cross section of the substrate during the deposition steps in the creation of the thermal inorganic resist which will be used in photolithography or mask creation.
Figure 1B:
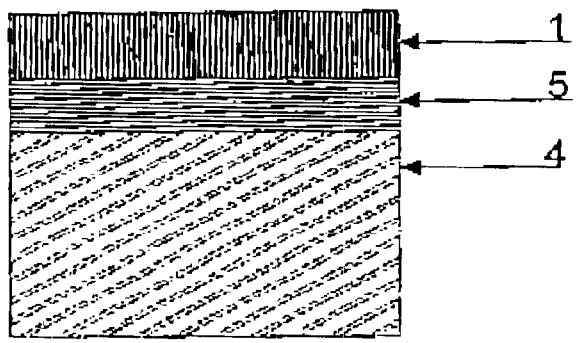

The invention will now be described with reference to the drawings in which the reference numbers designate similar features.

As shown in FIGS. 1A to 7, this invention discloses a general class of dry inorganic thermal resists based on a multilayer process.

In its simplest form the thermally active layer consists of a lower thin film of one inorganic material and an overlying layer of another inorganic film. The lower and overlying layers may each be a layer of a single element metal or a binary metal alloy. In one example the overlying layer is a Bismuth film. In one example the lower layer is an Indium film. In more complex forms there may be more than two layers. The materials that are potential candidates for the two or more layer films are those which show in their phase diagrams a low temperature alloy, a eutectic, whose melting point is below that of the two individual films. Best results occur for eutectic temperatures below 300° C. and preferably below 200° C., with several good materials near 100° C. or below. Note some phase diagrams show more than one phase material ratio with temperatures below the individual layer melting points.

Candidate binary metal thermal resists are given in the following table, taken from phase diagrams in Hansen:

| | Eutectic 1 | | Eutectic 2 | |
|---|---|---|---|---|
| Element | Temperature ° C. | Composition | Temperature ° C. | Composition |
| AsPb | 288 | 7% As | | |
| BiCd | 144 | 45% Bi | | |
| BiCo | 258 | 90% Bi | | |
| BiIn | 72 | 22% Bi | 110 | 53% Bi |
| BiPb | 125 | 56% Bi | 184 | 36% Bi |
| BiSn | 139 | 43% Bi | | |
| BiZn | 254 | 92% Bi | | |
| CdIn | 123 | 74% In | | |
| CdPb | 248 | 72% Pb | | |
| CdSb | 290 | 7% Sb | 445 | 57% Sb |
| CdSn | 177 | 67% Sn | | |
| CdTi | 203 | 72% Ti | | |
| CdZn | 266 | 26% Zn | | |
| GaIn | 16 | 16% In | | |

-continued

| | Eutectic 1 | | Eutectic 2 | |
|---|---|---|---|---|
| Element | Temperature ° C. | Composition | Temperature ° C. | Composition |
| GaMg | 285 | 67% Ga | 422 | 19% Ga |
| GaSn | 20 | 5% Sn | | |
| GaZn | 25 | 5% Zn | | |
| InSn | 117 | 47% Sn | | |
| InZn | 143 | 7% Zn | | |
| MgPb | 253 | 85% Pb | 466 | 19% Pb |
| MgSn | 200 | 91% Sn | 561 | 11% Sn |
| MgTi | 203 | 80% Ti | 353 | 43% Ti |
| PbPd | 265 | 90% Pb | 454 | 61% Pb |
| PbPt | 290 | 95% Pb | | |
| PbSb | 252 | 18% Sb | | |
| PbSn | 183 | 26% Pb | | |
| SbTi | 195 | 30% Sb | | |
| SeTi | 172 | 73% Se | 284 | 43% Se |
| SnTi | 170 | 69% Sn | | |
| SnZn | 198 | 85% Sn | | |

Two embodiments, BiIn (with 53% Bi) and BiSn (with 43% Bi) will be used as the example embodiments in the detailed descriptions of the preferred embodiments. However any materials for the multilayer resist which from alloys that have melting temperatures below that of the individual layers (as do the binary alloys in the chart) form good candidates for this class of thermal resist. For the etching requirement alloys which contain significant percentages of both source materials give superior results.

Some particularly interesting other embodiments are BiIn (22% Bi), notable for its very low conversion temperatures (72° C.), and InSn (47% Sn) for its good compatibility with other silicon fabrication processes. Furthermore this chart does nor include resists where one or more layers is itself a compound material, especially including oxides, nitrides or hydrides, which are combined with a second layer to produce more complex compounds. In addition multilayer films, whose alloyed materials combine with oxygen, nitrogen or hydrogen from the surrounding atmosphere can form some interesting alloys with good resist characteristics. Also it is clear that more than two layer films, forming more complex alloys, can create resists that are useful, in some applications. In the detailed descriptions of the figures only two-layer resists are discussed.

Figure 1C:
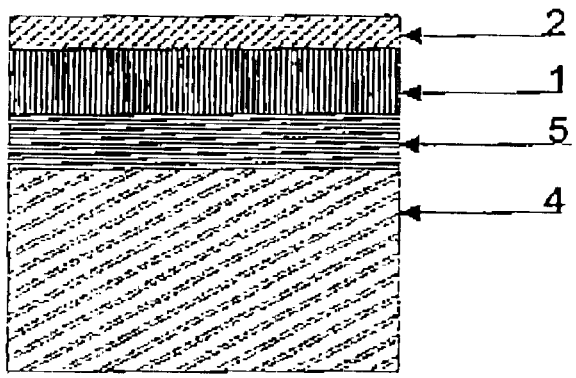
Figure 1D:
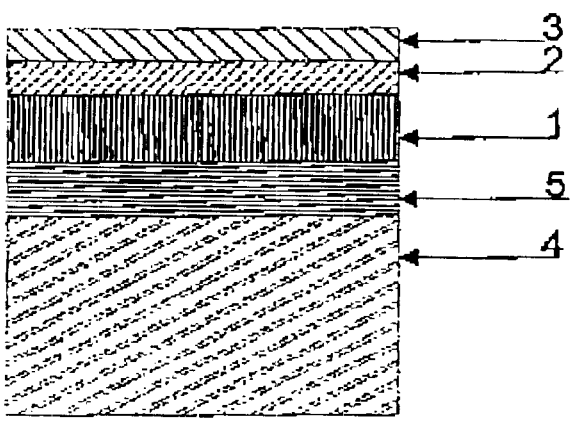

FIG. 1A through FIG. 1D illustrate, in simplified form, one embodiment of the processes used to deposit the thermal inorganic multilayer resist. In FIG. 1A, a wafer or device to be processed is provided. The wafer or device comprises a substrate 4 which may have been processed with lithography in previous operations and a layer 5 that is to be patterned by the resist. In one embodiment layer 5 could be a thermal oxide grown on a silicon wafer substrate 4. However in some applications the substrate 4 may be defined directly by the resist and no layer 5 will exist In FIG. 1B a resist protection layer 1 is deposited on top of the substrate layer to be patterned, typically layer 5. In one embodiment layer 1 is an amorphous Carbon film of between 0.2 and 1.0 microns thickness. Preferred deposition processes are dry procedures such as sputter coating, Chemical Vapour Deposition (CVD) or evaporation. In another embodiment, an organic polymer, like standard photoresist, may be used of similar thickness. In FIG. 1C deposition of a lower resist layer 2 then follows again preferentially using the dry sputter or CVD processes. In one embodiment layer 2 is an Indium film of between 5 and 200 nm thick and in a specific example 15 nm thick. In FIG. 1D an upper resist layer 3 is deposited on top of layer 4 again using the dry processes such as sputtering. Preferentially both resist layers 2 and 3 are done in the same deposition system without being exposed to the atmosphere between deposits. In one embodiment layer 3 is a Bismuth film of between 5 and 200 nm thick The thickness of the resist top layer is such that the percentage ratio will give the desired alloy. In the case of one BiIn alloy embodiment this requires approximately equal thicknesses for both layers 2 and 3. In a specific example a layer 3 of Bi film of 15 nm thick to equal that of the layer 2 film of In (the deposition control will probably not allow the exact ratio of 53% Bi).

Figure 2A:
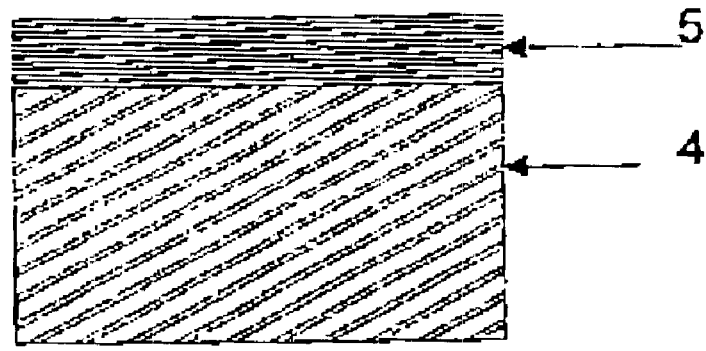
FIG. 2A through FIG. 2C illustrate an embodiment with a direct deposit of the thermal resist on the area to be patterned, and no protection layer.
Figure 2B:
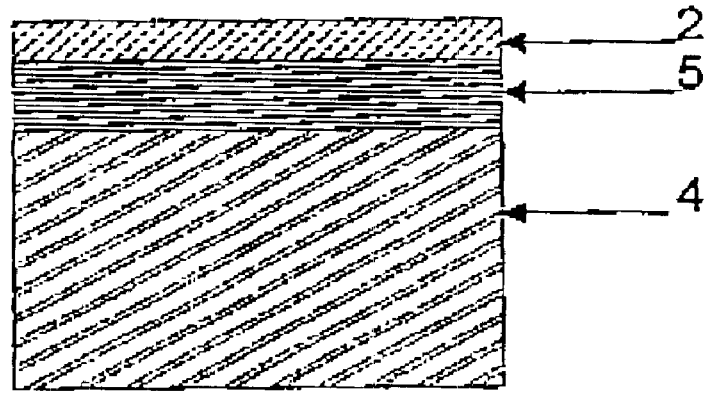
Figure 2C:
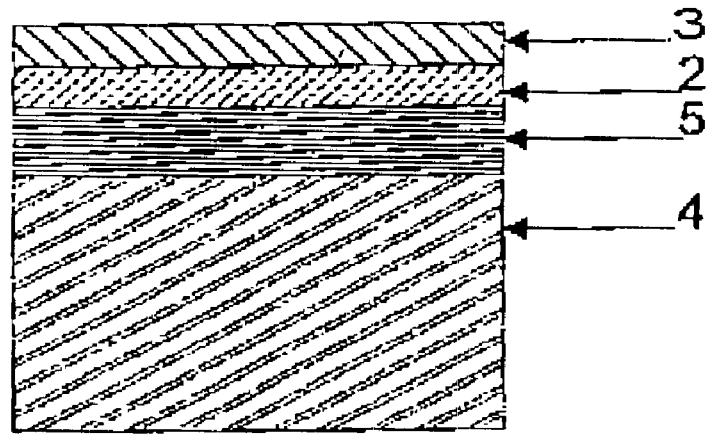

FIG. 2A through FIG. 2C illustrate an inorganic thermal resist process similar to the process illustrated by FIG. 1A through FIG. 1D but with the thermally active layers deposited directly on the layer to be defined 5 (FIG. 2A), without the deposition of the resist protection layer 1. In this embodiment the deposition of the lower resist layer FIG. 2B proceeds using the processes described for FIG. 1C. FIG. 2C shows the next step, the deposition of the upper resist layer using the processes described for FIG. 1D. This FIG. 2A through FIG. 2C process can be used in the creation of photomasks or the definition of very thin layers 5 which are to be etched.

FIG. 3A through FIG. 3G illustrate in simplified form one embodiment of the process steps used to pattern layer 5 with the thermal inorganic resist after their deposition as shown in FIG. 1A through FIG. 1D. FIG. 3A shows a simplified version of the exposure process and equipment. The light source 20, preferably a UV laser, produces a high power light pulse that is expanded by a lens system 21 into a uniform light illumination onto the photomask 22. The photomask 22 contains the pattern to be projected on the wafer (1–5), usually at a larger scale than the final desired pattern. The photomask contains dark patterns 22A that block the light and clear patterns 22B which transmit the light pulses. Lens system 23 then focuses the image from photomask 22 onto the surface of the top resist layer 3 creating image 24 of the mask opening pattern 22B. In most exposure systems this projected image 24 is shrunk relative to the mask pattern 22B by 5 to 10 times, which increases the effective power density of the light at the resist surface. This focused light penetrates the surface of the resist depositing energy in both the top layer 3 and bottom layer 2. The absorbed light thermally heats the resist, increasing the temperature above the reaction threshold. In the BiIn resist embodiment the 110° C. alloying temperature makes the resist responsive to low light levels. In the preferred embodiment because the eutectic melting temperature is well below that of the top resist layer 3 the alloy begins to form at the layer 2, 3 interface and forms a molten layer that rapidly expands into top and bottom resist layers. The temperature of the unalloyed layers will in some areas will exceed that of the eutectic point making for a rapid advance of this melt front into the heated illuminated area 10, but a slow advance into any non-illuminated resist. The result is an alloyed area 10 within unexposed resist that still consists of the separate layers 2 and 3. Thinner layers take less exposure energy to cause the alloying to occur so that the films of less than a total thickness of 70 nm (35 nm of Bi and 35 nm of In in one embodiment) usually provide the most sensitivity. Less desirably, but still useful if the resist thickness is too large or for some resist materials, the process may occur by melting the top resist layer 3 down to the interface, at which point the alloying begins. In one embodiment the 150 nm Bi and In layers fuse into a 300 nm thick BiIn alloy area at exposure levels greater than 40 mJ/sq. cm for 15 nm Bi and In layers.

It is possible, as noted that with some materials oxidation, nitridation or the formation of hydrides of the alloy may occur with the local atmosphere or with gases trapped in the film.

FIG. 3B shows the resist after exposure, with the alloyed areas 10 replicating the pattern of the mask 22. These alloyed areas 10 in some materials have very different optical characteristics from the top resist layer 3 making the image directly observable after exposure. For a BiIn resist the films change from highly absorbing to nearly transparent. A BiIn resist as shown in FIG. 1A through FIG. 1D with 15 nm per layer films showed measured transmission changing from <7% in the unexposed areas to >50% and up to 95% (depending on the exposure conditions) in the near UV to visible light range (350–700 nm). BiSn thermal resist films also showed a tendency to transparency after exposure through this may be due to oxidation. Thicker films (200 nm) were measured with transmission less than 0.1%. Such changes in optical parameters allow the wafer to be inspected for defects. As the alloying processes is commonly not affected by repeated exposures this allows the resist to be re-exposed to correct low exposures or problems. Indeed as the image is observable the alignment of a re-exposure pattern can be to the exposed pattern and not to structures on the layer 5 or below, which gives better results. In addition the electrical conductivity of the alloyed areas were found to range from the same to 3 times larger than the unexposed areas. This means the transparent film may be conductive, which has important considerations for some types of etching.

FIG. 3C illustrates the wafer after a development etch. The etching process, either wet or dry (plasma or reactive ion etching) is used to remove the unexposed layers 2, 3 while only slowly attacking the alloyed layer 10. In the preferred embodiment of the BiIn resist a wet etch of $HNO_3$(70% solution): $CH_3COOH$: water in the ratio 1:3:6 will etch away the Bi and In layers 2, 3 while reducing alloyed areas 10 by less than 30%. The etchants chosen must be compatible with the resists and alloys used. In some cases a small amount of alloy will form at the interface during deposition and this will leave small grains of a remnant material after the etching. This remnant alloy can be removed with a less etching version of the resist stripping process. In the preferred embodiment of a BiIn resist a dilute RCA 2 strip of $HCL:H_2O_2:H_2O$ in the ratio 1:1:48 at room temperature has proven effective in removing this remnant.

FIG. 3D illustrates the development etch of the protection resist layer 1 which replicates the image of the thermal resist alloyed pattern 10 into the protection resist. Preferentially an anisotropic etch, such as a plasma or reactive ion etch, should be used to get the best pattern transfer. In one particular embodiment with an amorphous carbon protection layer 1 an oxygen plasma etch will remove the carbon not protected by the alloyed resist areas 10. The purpose of the protection resist is two fold. It provides a thicker resist area than the thin thermal resist for etching processes that may attack the resist (for example ion milling). Secondly, some etches needed to pattern particular layer 5 materials will attack the thermal resist. At the same time the thermal resist layer provides protection to etches that would attack the protection layer 1, such as oxygen plasma. Using a protective resist layer 1, in one embodiment an amorphous carbon layer, combined with the protection of the thermal resist layer will provide good resist to almost all plasma etches.

FIG. 3E illustrates the result after etching the layer 5 with the correct etch for that layer, and thus transferring the pattern from the thermal resist alloyed area 10 to the layer 5. Preferentially this would be done with a dry plasma or reactive ion etch. In one embodiment, where layer 5 is a thermal silicon oxide (glass), a fluorine containing plasma, such as $CF_4$, would etch the glass down to the silicon substrate 4 while only slightly attacking the thermal resist layers.

FIG. 3F shows the first resist stripping step where the thermal resist pattern 10 is removed. This may be done by processes such as wet etches or dry etches or ion milling (as the thermal resist layer is so thin). Ea the particular case of the BiIn resist a wet etch which is identical to the standard RCA clean (RCA2 or $HCl:H_2O_2:H_2O$ in the ratio 2:3;14 at 80° C.) has proven effective in stripping the alloyed resist. This RCA clean is already commonly used in microfabrication processes.

FIG. 3G illustrates the second stripping step which removes protection layer 1. In the particular embodiment of an amorphous carbon protection layer an oxygen plasma is very effective. Note depending on the processes used it may be best to reverse these last two stripping the protection layer first and then removing the thermal resist in cleanup operation. In the particular embodiment of the BiIn and carbon films that would mean an oxygen plasma followed by the RCA2 wet etch as a clean up.

Figure 4A:
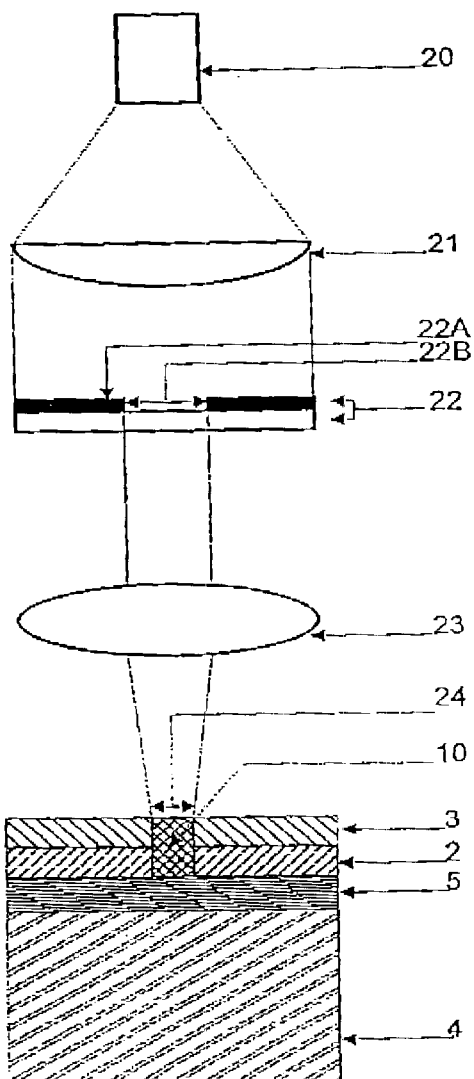
FIG. 4A through FIG. 4D are partial schematic representations of one embodiment of the schematic cross section of the substrate and resist of FIG. 2A through FIG. 2C during the photolithographic processes which will pattern the resist with exposure and a development etch, and transfer that pattern by etch to the layers of the substrate.
Figure 4B:
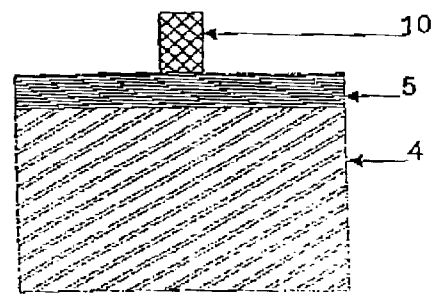
Figure 4C:
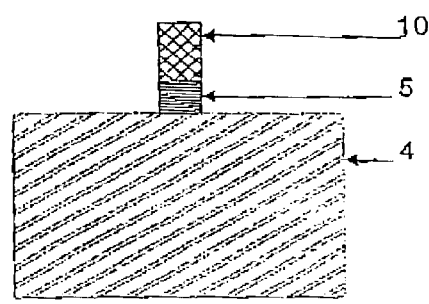
Figure 4D:
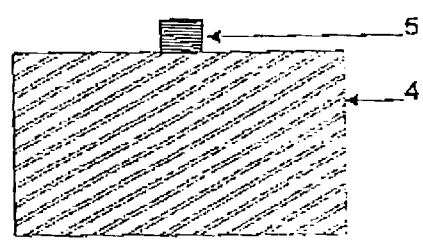

FIG. 4A through FIG. 4D illustrate a similar process to FIG. 3A through FIG. 3G but with resist directly deposited on the wafer as in FIG. 2A through FIG. 2C. Thus the resist exposure of FIG. 4A is similar to that of FIG. 3A but may involve different illumination levels due to the thermal flow to layer 5. The patterned wafer is etched in FIG. 4B as described in FIG. 3C, and the layer 5 patterned in FIG. 4C as described in FIG. 3E. Then the resist is stripped in FIG. 4D as described in FIG. 3F.

Figure 5B:
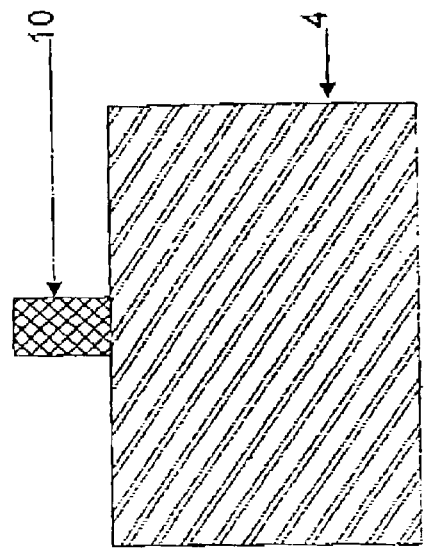
FIG. 5A and FIG. 5B are partial schematic representations of one embodiment of the schematic cross section of the substrate and resist of FIG. 2A through FIG. 2C during a direct laser write processes which will pattern the resist with exposure and a development etch.
Figure 5A:
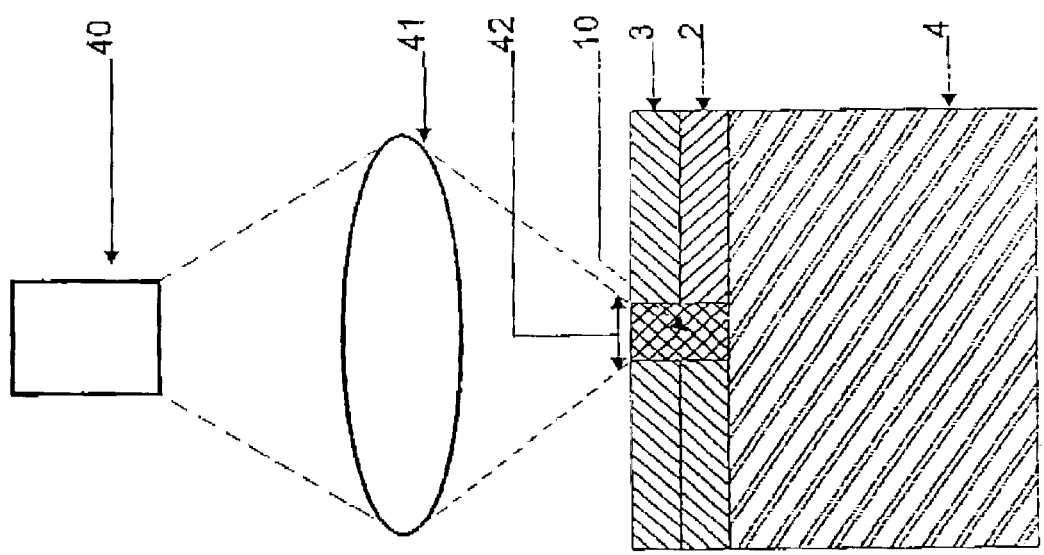

FIG. 5A and FIG. 5B illustrate a laser direct write process. In FIG. 5A a laser source 40 is focused by a lens system 41 onto the top of the thermal resist layer 3. The resulting laser spot 42 exposes and heats the resist locally creating a small alloyed area 10. The laser can be scanned over the resist surface and its intensity controlled with position to create a laser directly written pattern. Such direct write systems can be used to create specially patterned lithography layers or to write masks. After patterning the wafer is etched as per steps of FIG. 3C to yield a resist patter as in FIG. 5A and FIG. 5B. It is possible to do all the steps of FIG. 3A through FIG. 3G in the same manner but with a direct write laser.

Figure 6:
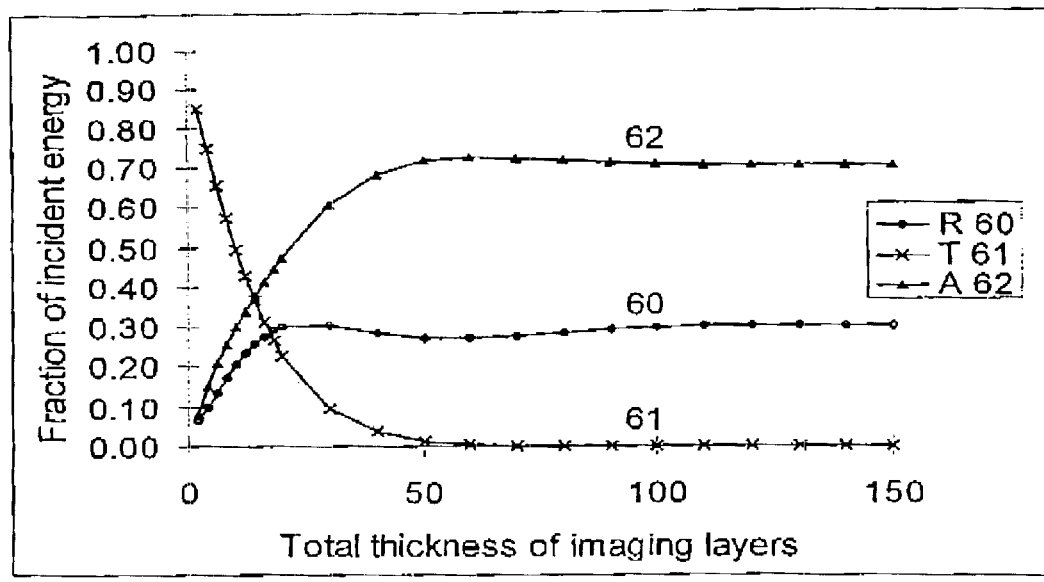
FIG. 6 illustrates for one embodiment of the resist of FIG. 1A through FIG. 1D the calculated variation with resist thickness of the optical reflectivity, energy absorbed in the resist, and the light transmitted through the resist during the exposures of FIG. 3A through FIG. 5B.

FIG. 6 illustrates the optical characteristics of the films that must be considered to determine the combined layer thickness and the order of the layers. FIG. 6 illustrates one embodiment of the optical behavour, the In layer 2, Bi layer 3 resist characteristics at 248 nm wavelength. Showing the variation with the total resist thickness of layers 2 and 3 the plot gives the reflection curve 60 from the Bi layer 3, the transmitted light curve 61 out of the lower edge of the bottom In layer 2, and the absorption curve 62 for energy in the combined resist layers. The order of which material is on the top layer is often to give a minimum reflection and maximum absorption when the film is set using curve like this. For proper choice of resists the layers 2 and 3 materials' optical index of refraction and absorption index at the desired wavelengths must be measured or calculated to obtain these curves. As many films are highly absorbing metals these curve calculations must be done using optical multilayer thin film analysis including complex indexes and the effects of internal reflection using well known methods to practitioners of the art. For metal layer resists these optical characteristics results in modestly more energy being deposited in the resist at shorter wavelengths. Thus the optical exposure threshold only changes modestly from UV at 350 nm to the deep UV at 150 nm or shorter. Since the metals, unlike organics, do not tend to suffer photoablation at wavelengths for modest exposures in the 150 to 250 nm range this makes them good candidates for the deep UV resists desired for advanced lithographic images For lithographic resists the reflection from the film surface should be minimized but the transmission of light from the lower layer is not to important. However in other applications, like the generation of photomasks, the transmitted light of curve 61 out of the bottom layer 2 should be below some value. This would require thicker films. In one embodiment to get a transmission of less than 0.1% for Bi on In each layer must be 35 nm thick, are required by FIG. 6 curves. Such thicker films will be less optically sensitive, but provide better blocking of light in unexposed areas. For increased protection an overcoating layer can be added to the photomask on top of the active layers. Such a protective transparent overcoat can be a cross-linked organic material or an inorganic layer, typically silicon dioxide.

Figure 7:
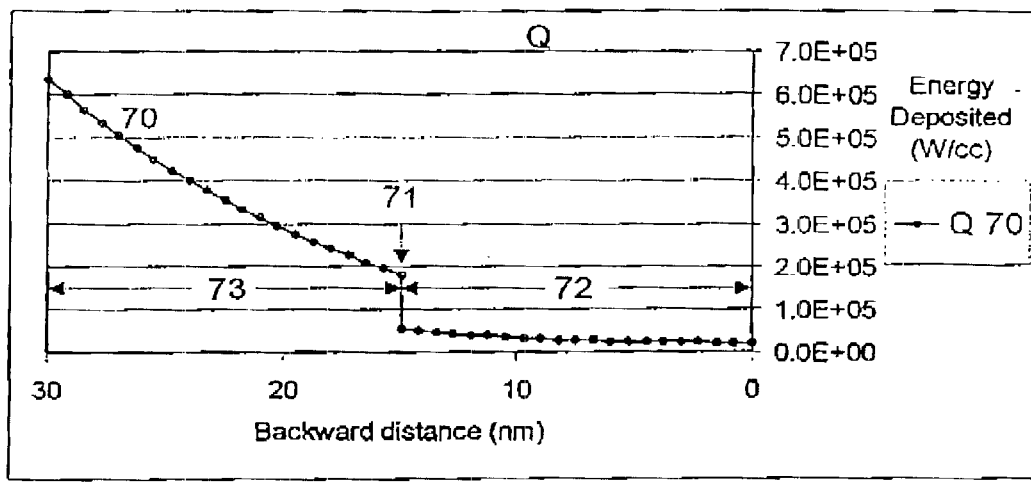
FIG. 7 illustrates a calculation of the energy deposition with depth in one embodiment of the inorganic thermal resist of FIG. 1A through FIG. 1D during the photolithographic exposures in FIG. 3A through FIG. 5B.

FIG. 7 illustrates the energy Q deposited per unit volume (W/cc) by the light as it varies in curve 70 through the thickness of the resist layers, with the bottom of layer 2 being 0 height of resist. FIG. 7 illustrates one embodiment, an In layer 2 of 15 nm thickness, Bi layer 3 of 15 nm, for illumination at 248 nm wavelength. The portion of Q curve 70 labelled 72 is the energy deposited in the bottom layer 2 of In, while 73 is the energy deposition rate in the top resist layer 3 of Bi. Total film thicknesses are best when the optical energy absorption rate Q allows energy deposition in both film layers. Note the sudden drop of the Q energy deposition at the BiIn interface, point 71 (15 nm thickness). With longer wavelengths or different materials the Q rate will be higher in the bottom layer 2 (In) near the interface then at the top of the top layer 3 (Bi) just above the interface 71. These calculations are done using Poynting Vector analysis, including the effects of internal reflections, using well-known methods to practitioners of the art. In general the actual energy Q deposited in the film per unit volume increases as thickness decreases. Since a higher Q results in greater temperatures for a given illumination level, and especially higher temperature at the interface, this creates more sensitive thinner films, especially for total film thickness less than 70 nm.

Note that the ability of the BiIn resist to become transparent with exposure suggests that it can be directly used with a direct write laser system as in FIG. 5A and FIG. 5B to produce photomasks without etching the resist. Depending on the exposure levels and film thickness the BiIn alloys show transparency into the UV to 350 nm before absorption begins to rise. Some films indicate this transmission may extend to shorter wavelengths. At wavelengths in which it does not transmit the more common resist development and etch process would be used to create masks. In either case this should create a more defect free mask as the standard mask steps of photoresist application and stripping could be skipped. This direct writing of images on resist films suggests these same materials may be useful for optical information storage.

What is claimed is:

1. A method of creating an inorganic thermal resist, the method comprising:

depositing a first layer of an inorganic thin film on a substrate, the first layer consisting of a layer of a single element metal;

depositing one or more subsequent layers of another inorganic material or materials; and, imagewise exposing the layers, the exposing creating a resultant material with different etching characteristics from the first and subsequent layers.

2. A method for creating an inorganic thermal resist, the method comprising:

depositing on a substrate a first layer of an inorganic thin film comprising a first inorganic material;

depositing one or more subsequent layers of one or more second inorganic materials; and, imagewise exposing the first and subsequent layers, the exposing creating, in at least one exposed areas, a resultant material having a melting point below melting points of the first and subsequent layers, the resultant material forming a single continuous phase throughout each exposed area.

3. A method for creating an inorganic thermal resist, the method comprising:

depositing on a substrate a first layer of an inorganic thin film comprising a first inorganic material;

depositing one or more subsequent layers of one or more second inorganic materials; and, imagewise exposing the first and subsequent layers in at least one exposed area, the exposure creating a resultant material which is a eutectic alloy of the first and second materials, the eutectic alloy forming a single continuous phase throughout each exposed area.

4. A method for creating an inorganic thermal resist, the method comprising:

depositing on a substrate a first layer of an inorganic thin film comprising a first inorganic material;

depositing one or more subsequent layers of one or more second inorganic materials; and imagewise exposing the first and subsequent layers, the exposing causing one or more reactions with surrounding gases to create one or more oxides, nitrides or hydrides of an alloy of materials of the first and subsequent layers, the reactions creating a resultant material having different etching characteristics from any of the materials of the first and subsequent layers.

5. A method, as in claim 3 wherein the eutectic alloy has a melting point below 300 degrees centigrade.

6. A method as in claim 3 wherein the eutectic alloy contains at least 5 percent of one of the first and second inorganic materials.

7. A method as in any of claim 2, 3, 4, 5 or 6 wherein the first and second inorganic materials are metals.

8. A method for creating an inorganic thermal resist, the method comprising:

depositing on a substrate a first layer comprising a thin film of an inorganic material;

depositing one or more subsequent layers of another inorganic material or materials; and, imagewise exposing the layers, the exposing creating a resultant material with different etching characteristics from any of the layers of unexposed materials, wherein the resultant material has optical transmission characteristics different from optical transmission characteristics of the inorganic materials of the first and subsequent layers.

9. A method as in claim 2 wherein the resultant material has optical transmission characteristics different from any of the first and second inorganic materials.

10. A method as in claim 3 wherein the resultant material has optical transmission characteristics different from any of the first and second inorganic materials.

11. A method as in claim 4 wherein the resultant material has optical transmission characteristics different from any of the inorganic materials in the first and subsequent layers.

12. A method of creating an inorganic thermal resist comprising:

depositing a first layer of an inorganic thin film on a substrate;

depositing one or more subsequent layers of another inorganic material or materials; and, imagewise exposing of the layers, the exposing creating a resultant material with different etching characteristics from any of the layers of unexposed materials, wherein the resulting material has optical characteristics different from optical characteristics of materials of the first and subsequent layers such that exposed areas can be readily detected by simple illumination with optical radiation thus creating a visible image on the surface.

13. A method as in claim 2 wherein the resulting material has optical characteristics different from optical characteristics of materials of the first and subsequent layers such that exposed areas can be readily detected by simple illumination with optical radiation thus creating a visible image on the surface.

14. A method as in claim 3 wherein the resulting material has optical characteristics different from optical characteristics of materials of the first and subsequent layers such that exposed areas can be readily detected by simple illumination with optical radiation thus creating a visible image on the surface.

15. A method as in claim 4 wherein the resulting material has optical characteristics different from any of the unexposed materials such that exposed areas can be readily detected by simple illumination with optical radiation thus creating a visible image on the surface.

16. A method according to any of claim 1, 2, 3, or 4 wherein imagewise exposing comprises exposing the layers to directed radiation comprising optical illumination having wavelengths in the range of 10 nm to 100 microns.

17. A method according to any of claim 1, 2, 3, 4, 5 or 6 wherein imagewise exposing comprises directing at the layers a directed particle beam of electrons or ions.

18. A method according to any of claim 1, 2, 3, 4, 5, 6, 8, 9, 11, 12, 13, or 15 wherein the resultant material comprises any of the following binary alloys: AsPb, BiCd, BiCo, BiIn, BiPb, BiSn, BiZn, CdIn, CdPb, CdSb, CdSn, CdTi, CdZn, GaIn, GaMg, GaSn, GaZn, InSn, InZn, MgPb, MgSn, MgTi, PbPd, PbPt, PbSb, PbSn, SbTi, SeTi, SnTi, or SnZn.

19. A method for creating a patterned resist on a substrate, the method comprising:

providing on the substrate a first layer of a first material and a second layer of a second material, the first and second materials each having a melting point higher than a melting point of an alloy of the first and second materials;

imagewise exposing the substrate by heating selected adjoining portions of the first and second layers to imaging temperatures exceeding the melting point of the alloy and thereby causing the first and second layers to melt together to form the alloy in the selected adjoining portions;

the alloy having different etching characteristics from any of the layers of unexposed materials.

20. The method of claim 19 wherein the alloy is a binary alloy.

21. The method of claim 20 wherein the binary alloy is a binary alloy selected from the group consisting of AsPb, BiCd, BiCo, BiIn, BiPb, BiSn, Bizn, CdIn, CdPb, CdSb, CdSn, CdTi, CdZn, GaIn, GaMg, GaSn, GaZn, InSn, InZn, MgPb, MgSn, MgTi, PbPd, PbPt, PbSb, PbSn, SbTi, SeTi, SnTi, and SnZn.

22. The method of claim 19 wherein the imaging temperatures are lower than the melting points of the first and second materials.

23. The method of claim 19 wherein the first layer comprises an oxide layer.

24. The method of claim 19 wherein the alloy has optical properties which are different from optical properties of areas wherein the first and second layers are unexposed.

25. A method for creating a patterned resist on a substrate, the method comprising:

providing on the substrate a first layer of a first material and a second layer of a second material, the first and second materials each having a melting point higher than a melting point of an alloy of the first and second materials;

imagewise exposing the substrate by heating selected adjoining portions of the first and second layers to imaging temperatures exceeding the melting point of the alloy and thereby causing the first and second layers to melt together to form the alloy in the selected adjoining portions;

the alloy having different etching characteristics from unexposed portions of the first and second layers; and providing a protection layer between the substrate and the first layer and, after imagewise exposing the substrate, etching the substrate to remove unexposed portions of the first and second layers, and subsequently removing exposed portions of the protection layer.

26. The method of claim 25 wherein the protection layer comprises a layer of carbon.

27. The method of claim 19 wherein, for at least some wavelengths, the alloy is substantially transparent and the unexposed first and second layers are not substantially transparent.

28. A method as in claim 19 wherein each of the first and second layers are between 5 nm and 200 nm thick.

29. A method as in claim 19 wherein each of the first and second layers is deposited by a dry procedure selected from the group consisting of: sputter coating, chemical vapour deposition and evaporation.

30. A method for creating an inorganic patterned layer, the method comprising:

depositing a first layer of a first inorganic material on a substrate; and depositing one or more layers of one or more second inorganic materials on the first layer wherein an alloy of the first and second inorganic materials has a melting temperature lower than melting temperatures of the first inorganic material or any of the second inorganic materials; and, imagewise exposing the layers and thereby creating a continuous film, the continuous film comprising the layers in unexposed areas and the continuous film comprising a resultant material in exposed areas, the resultant material comprising an alloy of the first and one or more second organic materials.

31. The method of claim 30 comprising etching the imagewise exposed layers in an etchant in which the resultant material has etching characteristics different from any of the layers.

* * * * *